United States Patent
Zheng et al.

(10) Patent No.: US 9,537,037 B2
(45) Date of Patent: Jan. 3, 2017

(54) WET ETCHING METHOD FOR AN N-TYPE BIFACIAL CELL

(71) Applicant: Shanghai Shenzhou New Energy Development Co., Ltd., Shanghai (CN)

(72) Inventors: Fei Zheng, Shanghai (CN); Zhongwei Zhang, Shanghai (CN); Lei Shi, Shanghai (CN); Zhongli Ruan, Shanghai (CN); Chen Zhao, Shanghai (CN); Yuxue Zhao, Shanghai (CN)

(73) Assignee: Shanghai Shenzhou New Energy Development Co., Ltd., Shanghai (CN)

( * ) Notice: Subject to any disclaimer, the term of this patent is extended or adjusted under 35 U.S.C. 154(b) by 0 days.

(21) Appl. No.: 15/028,665

(22) PCT Filed: May 14, 2015

(86) PCT No.: PCT/CN2015/078932
§ 371 (c)(1),
(2) Date: Apr. 11, 2016

(87) PCT Pub. No.: WO2016/054917
PCT Pub. Date: Apr. 14, 2016

(65) Prior Publication Data
US 2016/0329451 A1    Nov. 10, 2016

(30) Foreign Application Priority Data
Oct. 8, 2014 (CN) .......................... 2014 1 0525546

(51) Int. Cl.
*H01L 21/00* (2006.01)
*H01L 31/068* (2012.01)
*H01L 31/18* (2006.01)

(52) U.S. Cl.
CPC ....... *H01L 31/0684* (2013.01); *H01L 31/1804* (2013.01)

(58) Field of Classification Search
CPC .. H01L 31/0684; H01L 31/1804; H01L 31/18; H01L 31/0216
USPC .......................................... 438/57
See application file for complete search history.

(56) References Cited

U.S. PATENT DOCUMENTS

| | | | |
|---|---|---|---|
| 2009/0038682 A1* | 2/2009 | Komatsu | H01L 31/02363 136/258 |
| 2012/0295447 A1* | 11/2012 | Tamboli | H01L 31/02363 438/753 |
| 2016/0111558 A1* | 4/2016 | Wong | H02S 50/00 136/256 |
| 2016/0233374 A1* | 8/2016 | Knight | H01L 31/02167 |
| 2016/0254173 A1* | 9/2016 | Edgerly | H01L 21/67086 |

* cited by examiner

*Primary Examiner* — Caleb Henry
(74) *Attorney, Agent, or Firm* — Wang Law Firm, Inc.

(57) ABSTRACT

A wet etching method for an N-type bifacial cell including: (1) providing an N-type silicon wafer, proceeding with surface structuralization on the N-type silicon wafer, and producing a PN junction on a surface of the N-type silicon wafer by using a boron diffusion technique; (2) proceeding with a first mixed acid washing, etching the PN junction on an edge and a back surface of the N-type silicon wafer; (3) proceeding with a first pure water washing and a first alkaline washing, removing residual acid solution from the surface of the N-type silicon wafer; (4) proceeding with a second pure water washing and a second mixed acid washing, removing residual impurities from the surface of the N-type silicon wafer; (5) proceeding with a third pure water washing and air drying; and (6) after air drying, completing etching on the N-type bifacial cell.

27 Claims, No Drawings

WET ETCHING METHOD FOR AN N-TYPE BIFACIAL CELL

FIELD OF THE INVENTION

The present invention relates to the field of design of the solar cell technology and, more particularly, to a wet etching method for an N-type bifacial cell.

DESCRIPTION OF THE PRIOR ART

N-type silicon wafers are silicon wafers doped with phosphorus. Since N-type silicon wafers have longer minority carrier life time, the resultant solar cells have higher optical-electrical conversion efficiency. N-type solar cells have received more attention in recent years. Furthermore, N-type cells have a higher tolerance to metal pollution and have better durability and stability. Furthermore, the N-type silicon wafers are doped with phosphorus and have no boron-oxygen pairs, such that photoluminescence degradation does not exist. Due to these advantages of N-type crystalline silicon, N-type silicon wafers are very suitable to produce high-efficiency solar cells. A typical process for producing an N-type bifacial cell includes: proceeding with a surface structuralization treatment on an N-type silicon wafer; forming a PN junction by high-temperature boron diffusion; etching away the PN junction on the edge and the back surface of the silicon wafer; producing an $N^+$ layer by back surface phosphorus diffusion; depositing antireflection films on two sides; double-side printing and sintering to finally obtain an N-type bifacial solar cell. As can be seen from the procedure of the above process for a bifacial cell, etching is a critical step. Since the N-type bifacial cell has boron doping on the front surface and phosphorus doping on the back surface, the edge of the cell will leak electricity if the edge isolation of the PN junction is not properly made, adversely affecting the electrical performance of the cell. Etching methods currently used in bifacial cells include plasma etching and laser etching, both of which have certain drawbacks. The disadvantages of plasma etching include incomplete removal of the edge PN junction and unstable etching effect of the machine. Due to the equipment characteristics of laser etching, the etching process more or less causes a reduction in the light reception area of the cell, reducing the optical-electrical conversion efficiency of the bifacial cell.

BRIEF SUMMARY OF THE INVENTION

An objective of the present invention is to overcome the disadvantages of the prior art by providing a wet etching method for an N-type bifacial cell which increases the polishing effect on the back surface of the silicon wafer, which increases the passivation on the rear surface, and which increases the conversion efficiency of the cell.

The objective of the present invention is fulfilled by the following technical solutions.

The present invention provides a wet etching method for an N-type bifacial cell, including:

(1) providing an N-type silicon wafer, proceeding with surface structuralization on the N-type silicon wafer, and producing a PN junction on a surface of the N-type silicon wafer by using a boron diffusion technique;

(2) proceeding with a first mixed acid washing, etching the PN junction on an edge and a back surface of the N-type silicon wafer;

(3) proceeding with a first pure water washing and a first alkaline washing, removing residual acid solution from the surface of the N-type silicon wafer;

(4) proceeding with a second pure water washing and a second mixed acid washing, removing residual impurities from the surface of the N-type silicon wafer;

(5) proceeding with a third pure water washing and air drying; and (6) after air drying, completing etching on the N-type bifacial cell.

In the wet etching method for an N-type bifacial cell according to the present invention, under the premise of assuring the cell efficiency is not reduced, the polishing passivation effect on the back surface is increased by the corrosive function of the first mixed acid, thereby increasing the optical-electrical conversion efficiency of the N-type bifacial cell. Furthermore, increasing the etching on the edge and the back surface can remove the PN junction diffused to the edge of the N-type silicon wafer during the boron diffusion procedure and can remove boron silicon glass generated on the surface of the N-type silicon wafer during the diffusion procedure, avoiding the leakage problem on the edge of the N-type bifacial cell product.

Further improvement of the wet etching method for an N-type bifacial cell according to the present invention is that steps (2)-(5) are repeated in this technical solution. A better etching/polishing passivation effect is achieved by repeating a plurality of times.

Further improvement of the wet etching method for an N-type bifacial cell according to the present invention is that, in this technical solution, the first mixed acid washing uses a mixed solution of HF solution, $HNO_3$ solution, and $H_2SO_4$ solution having a volume ratio of 1:2:1 to 1:10:5, wherein the concentration of HF solution is 49 wt %, the concentration of $H_2SO_4$ solution is 99 wt %, and the concentration of $HNO_3$ solution is 70 wt %.

Further improvement of the wet etching method for an N-type bifacial cell according to the present invention is that, in this technical solution, the first alkaline washing uses a strong alkaline solution having a concentration of 0.5-15 wt %, and the strong alkaline solution includes NaOH solution or KOH solution.

Further improvement of the wet etching method for an N-type bifacial cell according to the present invention is that, in this technical solution, the second mixed acid washing uses a mixed solution of HF solution and HCl solution having a volume ratio of 1:10 to 10:1, wherein the concentration of HF solution is 49 wt %, and the concentration of HCl solution is 37 wt %.

The present invention further provides a wet etching method for an N-type bifacial cell, including:

(1) providing an N-type silicon wafer, proceeding with surface structuralization on the N-type silicon wafer, and producing a PN junction on a surface of the N-type silicon wafer by using a boron diffusion technique;

(2) covering a front surface of the N-type silicon wafer with a water film;

(3) proceeding with a first mixed acid etching processing to increase a passivation effect on a back surface of the N-type silicon wafer;

(4) proceeding with a first pure water washing and a first alkaline washing, removing residual acid solution from the surface of the N-type silicon wafer;

(5) proceeding with a second pure water washing and a second mixed acid washing, removing residual impurities from the surface of the N-type silicon wafer;

(6) proceeding with a third pure water washing and air drying; and (7) after air drying, completing etching on the N-type bifacial cell.

In the wet etching method for an N-type bifacial cell according to the present invention, the water film can achieve a function of protecting the front surface of the N-type silicon wafer. Under the premise of assuring the cell efficiency is not reduced, the polishing passivation effect on the back surface is increased by the corrosive function of the first mixed acid, thereby increasing the optical-electrical conversion efficiency of the N-type bifacial cell. Furthermore, increasing the etching on the edge and the back surface can remove the PN junction diffused to the edge of the N-type silicon wafer during the boron diffusion procedure and can remove boron silicon glass generated on the surface of the N-type silicon wafer during the diffusion procedure, avoiding the leakage problem on the edge of the N-type bifacial cell product.

Further improvement of the wet etching method for an N-type bifacial cell according to the present invention is that steps (2)-(6) are repeated in this technical solution. A better etching/polishing passivation effect is achieved by repeating a plurality of times.

Further improvement of the wet etching method for an N-type bifacial cell according to the present invention is that, in this technical solution, pure water is used to form the water film covering the front surface of the N-type silicon wafer, and the water film completely covers the front surface of the N-type silicon wafer.

Further improvement of the wet etching method for an N-type bifacial cell according to the present invention is that, in this technical solution, the first mixed acid washing uses a mixed solution of HF solution and $HNO_3$ solution having a volume ratio of 1:10 to 10:1, wherein the concentration of HF solution is 49 wt %, and the concentration of $HNO_3$ solution is 70 wt %.

Further improvement of the wet etching method for an N-type bifacial cell according to the present invention is that, in this technical solution, the first alkaline washing uses a strong alkaline solution having a concentration of 0.5-15 wt %, and the strong alkaline solution includes NaOH solution, KOH solution, or sodium carbonate solution.

Further improvement of the wet etching method for an N-type bifacial cell according to the present invention is that, in this technical solution, the second mixed acid washing uses a mixed solution of HF solution and HCl solution having a volume ratio of 1:10 to 10:1, wherein the concentration of HF solution is 49 wt %, and the concentration of HCl solution is 37 wt %.

The present invention further provides a wet etching method for an N-type bifacial cell, including:

(1) providing an N-type silicon wafer, proceeding with surface structuralization on the N-type silicon wafer, and producing a PN junction on a surface of the N-type silicon wafer by using a boron diffusion technique;

(2) proceeding with a first mixed acid washing, etching the PN junction on an edge and a back surface of the N-type silicon wafer;

(3) proceeding with a first pure water washing and a first alkaline washing, removing residual acid solution from the surface of the N-type silicon wafer;

(4) proceeding with a second pure water washing and a second mixed acid washing, removing residual impurities from the surface of the N-type silicon wafer;

(5) proceeding with a third pure water washing and air drying;

(6) covering a front surface of the N-type silicon wafer with a water film;

(7) proceeding with a third mixed acid etching processing to increase a passivation effect on the back surface of the N-type silicon wafer;

(8) proceeding with a fourth pure water washing and a second alkaline washing, removing residual acid solution on the surface of the N-type silicon wafer;

(9) proceeding with a fifth pure water washing and a fourth mixed acid washing, removing residual impurities from the surface of the N-type silicon wafer;

(10) proceeding with a sixth pure water washing and air drying; and

(11) after air drying, completing etching on the N-type bifacial cell.

In the wet etching method for an N-type bifacial cell according to the present invention, the water film can achieve a function of protecting the front surface of the N-type silicon wafer. Under the premise of assuring the cell efficiency is not reduced, the polishing passivation effect on the back surface is further increased by the corrosive function of the first mixed acid and the third mixed acid, thereby increasing the optical-electrical conversion efficiency of the N-type bifacial cell. Furthermore, increasing the etching on the edge and the back surface can remove the PN junction diffused to the edge of the N-type silicon wafer during the boron diffusion procedure and can remove boron silicon glass generated on the surface of the N-type silicon wafer during the diffusion procedure, avoiding the leakage problem on the edge of the N-type bifacial cell product.

Further improvement of the wet etching method for an N-type bifacial cell according to the present invention is that, in this technical solution, the first mixed acid washing uses a mixed solution of HF solution, $HNO_3$ solution, and $H_2SO_4$ solution having a volume ratio of 1:2:1 to 1:10:5, wherein the concentration of HF solution is 49 wt %, the concentration of $H_2SO_4$ solution is 99 wt %, and the concentration of $HNO_3$ solution is 70 wt %.

Further improvement of the wet etching method for an N-type bifacial cell according to the present invention is that, in this technical solution, the first alkaline washing uses a strong alkaline solution having a concentration of 0.5-15 wt %, and the strong alkaline solution includes NaOH solution or KOH solution.

Further improvement of the wet etching method for an N-type bifacial cell according to the present invention is that, in this technical solution, the second mixed acid washing uses a mixed solution of HF solution and HCl solution having a volume ratio of 1:10 to 10:1, wherein the concentration of HF solution is 49 wt %, and the concentration of HCl solution is 37 wt %.

Further improvement of the wet etching method for an N-type bifacial cell according to the present invention is that, in this technical solution, pure water is used to form the water film covering the front surface of the N-type silicon wafer, and the water film completely covers the front surface of the N-type silicon wafer.

Further improvement of the wet etching method for an N-type bifacial cell according to the present invention is that, in this technical solution, the third mixed acid washing uses a mixed solution of HF solution and $HNO_3$ solution having a volume ratio of 1:10 to 10:1, wherein the concentration of HF solution is 49 wt %, and the concentration of $HNO_3$ solution is 70 wt %.

Further improvement of the wet etching method for an N-type bifacial cell according to the present invention is that, in this technical solution, the second alkaline washing uses a strong alkaline solution having a concentration of 0.5-15 wt %, and the strong alkaline solution includes NaOH solution, KOH solution, or sodium carbonate solution.

Further improvement of the wet etching method for an N-type bifacial cell according to the present invention is that, in this technical solution, the fourth mixed acid washing uses a mixed solution of HF solution and HCl solution having a volume ratio of 1:10 to 10:1, wherein the concentration of HF solution is 49 wt %, and the concentration of HCl solution is 37 wt %.

The present invention further provides a wet etching method for an N-type bifacial cell, including:

(1) providing an N-type silicon wafer, proceeding with surface structuralization on the N-type silicon wafer, and producing a PN junction on a surface of the N-type silicon wafer by using a boron diffusion technique;

(2) covering a front surface of the N-type silicon wafer with a water film;

(3) proceeding with a first mixed acid etching processing to increase a passivation effect on a back surface of the N-type silicon wafer;

(4) proceeding with a first pure water washing and a first alkaline washing, removing residual acid solution from the surface of the N-type silicon wafer;

(5) proceeding with a second pure water washing and a second mixed acid washing, removing residual impurities from the surface of the N-type silicon wafer;

(6) proceeding with a third pure water washing and air drying;

(7) proceeding with a third mixed acid washing, etching the PN junction on an edge and the back surface of the N-type silicon wafer;

(8) proceeding with a fourth pure water washing and a second alkaline washing, removing residual acid solution from the surface of the N-type silicon wafer;

(9) proceeding with a fifth pure water washing and a fourth mixed acid washing, removing residual impurities from the surface of the N-type silicon wafer;

(10) proceeding with a sixth pure water washing and air drying; and

(11) after air drying, completing etching on the N-type bifacial cell.

In the wet etching method for an N-type bifacial cell according to the present invention, the water film can achieve a function of protecting the front surface of the N-type silicon wafer. Under the premise of assuring the cell efficiency is not reduced, the polishing passivation effect on the back surface is further increased by the corrosive function of the first mixed acid and the third mixed acid, thereby increasing the optical-electrical conversion efficiency of the N-type bifacial cell. Furthermore, increasing the etching on the edge and the back surface can remove the PN junction diffused to the edge of the N-type silicon wafer during the boron diffusion procedure and can remove boron silicon glass generated on the surface of the N-type silicon wafer during the diffusion procedure, avoiding the leakage problem on the edge of the N-type bifacial cell product.

Further improvement of the wet etching method for an N-type bifacial cell according to the present invention is that, in this technical solution, pure water is used to form the water film covering the front surface of the N-type silicon wafer, and the water film completely covers the front surface of the N-type silicon wafer.

Further improvement of the wet etching method for an N-type bifacial cell according to the present invention is that, in this technical solution, the first mixed acid washing uses a mixed solution of HF solution and $HNO_3$ solution having a volume ratio of 1:10 to 10:1, wherein the concentration of HF solution is 49 wt %, and the concentration of $HNO_3$ solution is 70 wt %.

Further improvement of the wet etching method for an N-type bifacial cell according to the present invention is that, in this technical solution, the first alkaline washing uses a strong alkaline solution having a concentration of 0.5-15 wt %, and the strong alkaline solution includes NaOH solution, KOH solution, or sodium carbonate solution.

Further improvement of the wet etching method for an N-type bifacial cell according to the present invention is that, in this technical solution, the second mixed acid washing uses a mixed solution of HF solution and HCl solution having a volume ratio of 1:10 to 10:1, wherein the concentration of HF solution is 49 wt %, and the concentration of HCl solution is 37 wt %.

Further improvement of the wet etching method for an N-type bifacial cell according to the present invention is that, in this technical solution, the third acid washing uses a mixed solution of HF solution, $HNO_3$ solution, and $H_2SO_4$ solution having a volume ratio of 1:2:1 to 1:10:5, wherein the concentration of HF solution is 49 wt %, the concentration of $H_2SO_4$ solution is 99 wt %, and the concentration of $HNO_3$ solution is 70 wt %.

Further improvement of the wet etching method for an N-type bifacial cell according to the present invention is that, in this technical solution, the second alkaline washing uses a strong alkaline solution having a concentration of 0.5-15 wt %, and the strong alkaline solution includes NaOH solution or KOH solution.

Further improvement of the wet etching method for an N-type bifacial cell according to the present invention is that, in this technical solution, the fourth mixed acid washing uses a mixed solution of HF solution and HCl solution having a volume ratio of 1:10 to 10:1, wherein the concentration of HF solution is 49 wt %, and the concentration of HCl solution is 37 wt %.

DETAILED DESCRIPTION OF THE INVENTION

To more clearly understand the objectives, technical solutions, and advantages of the present invention, the present invention will be further described in connection with the accompanying drawings and embodiments. It is noted that the embodiments described herein are merely used to explain the present invention and should not be used to restrict the present invention.

EXAMPLE 1

In the first example, the wet etching method for an N-type bifacial cell according to the present invention includes:

(1) providing an N-type silicon wafer, proceeding with surface structuralization on the N-type silicon wafer, and producing a PN junction on a surface of the N-type silicon wafer by using a boron diffusion technique;

(2) proceeding with a first mixed acid washing, etching the PN junction on an edge and a back surface of the N-type silicon wafer;

(3) proceeding with a first pure water washing and a first alkaline washing, removing residual acid solution from the surface of the N-type silicon wafer;

(4) proceeding with a second pure water washing and a second mixed acid washing, removing residual impurities from the surface of the N-type silicon wafer;

(5) proceeding with a third pure water washing and air drying; and (6) after air drying, completing etching on the N-type bifacial cell.

Preferably, the first mixed acid washing used a mixed solution of HF solution, $HNO_3$ solution, and $H_2SO_4$ solution having a volume ratio of 1:2:1 to 1:10:5, wherein the concentration of HF solution was 49 wt %, the concentration of $H_2SO_4$ solution was 99 wt %, and the concentration of $HNO_3$ solution was 70 wt %. The first alkaline washing used a strong alkaline solution having a concentration of 0.5-15 wt %, and the strong alkaline solution included NaOH solution or KOH solution. The second mixed acid washing used a mixed solution of HF solution and HCl solution having a volume ratio of 1:10 to 10:1, wherein the concentration of HF solution was 49 wt %, and the concentration of HCl solution was 37 wt %.

Specifically, an N-type silicon wafer was provided, surface structuralization was proceeded on the N-type silicon wafer, and a PN junction was produced on the surface (including the front surface, the back surface, and the edge) of the N-type silicon wafer by using a Boron diffusion technique. A first mixed acid consisting of HF solution, $HNO_3$ solution, and $H_2SO_4$ solution was used to etch the PN junction on the edge and the back surface of the N-type silicon wafer, leaving the PN junction on the front surface to increase the polishing passivation effect of the back surface. Then, a first pure water washing and KOH solution washing were carried out to remove residual acid solution from the surface of the N-type silicon wafer. Next, a second pure water washing and a second mixed acid consisting of HF solution and HCl solution mixed at a volume ratio of 3:1 were used to remove residual impurities from the surface of the N-type silicon wafer. Finally, a third pure water washing and air drying were conducted, completing etching on the N-type bifacial cell.

TABLE 1

| | cell efficiency (%) | parallel resistance (Ω) | reverse leakage (A) |
|---|---|---|---|
| Comparative example | 19.939 | 61.2792 | 0.33 |
| Example 1 | 20.063 | 848.6711 | 0.062 |

Table 1 shows the data contrast between the reverse leakage of the present invention and the reverse leakage of a comparative example. As can be seen from the reverse leakage data of Table 1, the reverse leakage of the present invention is obviously smaller than the reverse leakage of the comparative example.

In the wet etching method for an N-type bifacial cell according to the present invention, under the premise of assuring the cell efficiency is not reduced, the polishing passivation effect on the back surface is increased by the corrosive function of the first mixed acid, thereby increasing the optical-electrical conversion efficiency of the N-type bifacial cell. Furthermore, increasing the etching on the edge and the back surface can remove the PN junction diffused to the edge of the N-type silicon wafer during the boron diffusion procedure and can remove boron silicon glass generated on the surface of the N-type silicon wafer during the diffusion procedure, avoiding the leakage problem on the edge of the N-type bifacial cell product. Furthermore, steps (2)-(5) can be repeated in this technical solution. A better etching/polishing passivation effect is achieved by repeating a plurality of times.

EXAMPLE 2

In the second example, the wet etching method for an N-type bifacial cell according to the present invention includes:

(1) providing an N-type silicon wafer, proceeding with surface structuralization on the N-type silicon wafer, and producing a PN junction on a surface of the N-type silicon wafer by using a boron diffusion technique;

(2) covering a front surface of the N-type silicon wafer with a water film;

(3) proceeding with a first mixed acid etching processing to increase a passivation effect on a back surface of the N-type silicon wafer;

(4) proceeding with a first pure water washing and a first alkaline washing, removing residual acid solution on the surface of the N-type silicon wafer;

(5) proceeding with a second pure water washing and a second mixed acid washing, removing residual impurities from the surface of the N-type silicon wafer;

(6) proceeding with a third pure water washing and air drying; and (7) after air drying, completing etching on the N-type bifacial cell.

Preferably, pure water was used to form the water film covering the front surface of the N-type silicon wafer, and the water film completely covered the front surface of the N-type silicon wafer. The first mixed acid washing used a mixed solution of a mixed solution of HF solution and $HNO_3$ solution having a volume ratio of 1:10 to 10:1, wherein the concentration of HF solution was 49 wt %, and the concentration of HCl solution was 70 wt %. The first alkaline washing used a strong alkaline solution having a concentration of 0.5-15 wt %, and the strong alkaline solution included NaOH solution, KOH solution, or sodium carbonate solution. The second mixed acid washing used a mixed solution consisting of HF solution and HCl solution having a volume ratio of 1:10 to 10:1, wherein the concentration of HF solution was 49 wt %, and the concentration of HCl was 37 wt %.

Specifically, an N-type silicon wafer was provided, surface structuralization was proceeded on the N-type silicon wafer, and a PN junction was produced on the surface (including the front surface, the back surface, and the edge) of the N-type silicon wafer by using a boron diffusion technique. The front surface of the N-type silicon wafer was covered by a film of pure water. A first mixed acid consisting of HF solution and $HNO_3$ solution was used to etch the PN junction on the edge and the back surface of the N-type silicon wafer, leaving the PN junction on the front surface to increase the polishing passivation effect of the back surface. Then, a first pure water washing and KOH solution washing were carried out to remove residual acid solution from the surface of the N-type silicon wafer. Next, a second pure water washing and a second mixed acid consisting of HF solution and HCl solution mixed at a volume ratio of 5:1 were used to remove residual impurities from the surface of the N-type silicon wafer. Finally, a third pure water washing and air drying were conducted, completing etching on the N-type bifacial cell.

TABLE 2

| | cell efficiency (%) | parallel resistance (Ω) | reverse leakage (A) |
|---|---|---|---|
| Comparative example | 19.821 | 29.1171 | 0.68 |
| Example 2 | 20.090 | 959.7968 | 0.056 |

Table 2 shows the data contrast between the reverse leakage of the present invention and the reverse leakage of a comparative example. As can be seen from the reverse leakage data of Table 2, the reverse leakage of the present invention is obviously smaller than the reverse leakage of the comparative example.

In the wet etching method for an N-type bifacial cell according to the present invention, the water film can achieve a function of protecting the front surface of the N-type silicon wafer. Under the premise of assuring the cell efficiency is not reduced, the polishing passivation effect on the back surface is increased by the corrosive function of the first mixed acid, thereby increasing the optical-electrical conversion efficiency of the N-type bifacial cell. Furthermore, increasing the etching on the edge and the back surface can remove the PN junction diffused to the edge of the N-type silicon wafer during the boron diffusion procedure and can remove boron silicon glass generated on the surface of the N-type silicon wafer during the diffusion procedure, avoiding the leakage problem on the edge of the N-type bifacial cell product.

Furthermore, steps (2)-(6) can be repeated in this technical solution. A better etching/polishing passivation effect is achieved by repeating a plurality of times.

EXAMPLE 3

In the third example, the wet etching method for an N-type bifacial cell according to the present invention includes:

(1) providing an N-type silicon wafer, proceeding with surface structuralization on the N-type silicon wafer, and producing a PN junction on a surface of the N-type silicon wafer by using a boron diffusion technique;

(2) proceeding with a first mixed acid washing, etching the PN junction on an edge and a back surface of the N-type silicon wafer;

(3) proceeding with a first pure water washing and a first alkaline washing, removing residual acid solution from the surface of the N-type silicon wafer;

(4) proceeding with a second pure water washing and a second mixed acid washing, removing residual impurities from the surface of the N-type silicon wafer;

(5) proceeding with a third pure water washing and air drying;

(6) covering a front surface of the N-type silicon wafer with a water film;

(7) proceeding with a third mixed acid etching processing to increase a passivation effect on the back surface of the N-type silicon wafer;

(8) proceeding with a fourth pure water washing and a second alkaline washing, removing residual acid solution from the surface of the N-type silicon wafer;

(9) proceeding with a fifth pure water washing and a fourth mixed acid washing, removing residual impurities from the surface of the N-type silicon wafer;

(10) proceeding with a sixth pure water washing and air drying; and

(11) after air drying, completing etching on the N-type bifacial cell.

Preferably, pure water was used to form the water film covering the front surface of the N-type silicon wafer, and the water film completely covered the front surface of the N-type silicon wafer. The first mixed acid washing used a mixed solution of HF solution, $HNO_3$ solution, and $H_2SO_4$ solution having a volume ratio of 1:2:1 to 1:10:5, wherein the concentration of HF solution was 49 wt %, the concentration of $H_2SO_4$ solution was 99 wt %, and the concentration of $HNO_3$ solution was 70 wt %. The first alkaline washing used a strong alkaline solution having a concentration of 0.5-15 wt %, and the strong alkaline solution included NaOH solution or KOH solution. The second mixed acid washing used a mixed solution of HF solution and HCl solution having a volume ratio of 1:10 to 10:1, wherein the concentration of HF solution was 49 wt %, and the concentration of HCl solution was 37 wt %. The third mixed acid washing used a mixed solution of HF solution and $HNO_3$ solution having a volume ratio of 1:10 to 10:1, wherein the concentration of HF solution was 49 wt %, and the concentration of $HNO_3$ solution was 70 wt %. The second alkaline washing used a strong alkaline solution having a concentration of 0.5-15 wt %, and the strong alkaline solution included NaOH solution, KOH solution, or sodium carbonate solution. The fourth mixed acid washing used a mixed solution of HF solution and HCl solution having a volume ratio of 1:10 to 10:1, wherein the concentration of HF solution was 49 wt %, and the concentration of HCl solution was 37 wt %.

Specifically, an N-type silicon wafer was provided, surface structuralization was proceeded on the N-type silicon wafer, and a PN junction was produced on the surface (including the front surface, the back surface, and the edge) of the N-type silicon wafer by using a boron diffusion technique. A first mixed acid consisting of HF solution, $HNO_3$ solution, and $H_2SO_4$ solution mixed at a volume ratio of 1:2:1 was used to etch the PN junction on the edge and the back surface of the N-type silicon wafer, leaving the PN junction on the front surface to increase the polishing passivation effect of the back surface. Then, a first pure water washing and 0.5 wt % NaOH solution washing were carried out to remove residual acid solution from the surface of the N-type silicon wafer. Next, a second pure water washing and a second mixed acid consisting of HF solution and HCl solution mixed at a volume ratio of 1:10 were used to remove residual impurities from the surface of the N-type silicon wafer. Then, a third pure water washing and air drying were conducted. Then, the front surface of the N-type silicon wafer was covered by a film of pure water. Next, a third mixed acid consisting of HF solution and $HNO_3$ solution mixed at a volume ratio of 1:10 was used to etch the PN junction on the edge and the back surface of the N-type silicon wafer, increasing the polishing passivation effect of the back surface. Then, a fourth pure water washing and 0.5 wt % KOH solution washing were carried out to remove residual acid solution from the surface of the N-type silicon wafer. Next, a fifth pure water washing and a fourth mixed acid solution consisting of HF solution and HCl solution mixed at a volume ratio of 1:10 were used to remove residual impurities from the surface of the N-type silicon wafer. Finally, a sixth pure water washing and air drying were conducted, completing etching on the N-type bifacial cell.

In the wet etching method for an N-type bifacial cell according to the present invention, the water film can achieve a function of protecting the front surface of the N-type silicon wafer. Under the premise of assuring the cell efficiency is not reduced, the polishing passivation effect on the back surface is further increased by the corrosive function of the first mixed acid and the third mixed acid, thereby increasing the optical-electrical conversion efficiency of the N-type bifacial cell. Furthermore, increasing the etching on the edge and the back surface can remove the PN junction diffused to the edge of the N-type silicon wafer during the boron diffusion procedure and can remove boron silicon glass generated on the surface of the N-type silicon wafer during the diffusion procedure, avoiding the leakage problem on the edge of the N-type bifacial cell product.

EXAMPLE 4

In the fourth example, the wet etching method for an N-type bifacial cell according to the present invention includes:

(1) providing an N-type silicon wafer, proceeding with surface structuralization on the N-type silicon wafer, and producing a PN junction on a surface of the N-type silicon wafer by using a boron diffusion technique;

(2) covering a front surface of the N-type silicon wafer with a water film;

(3) proceeding with a first mixed acid etching processing to increase a passivation effect on a back surface of the N-type silicon wafer;

(4) proceeding with a first pure water washing and a first alkaline washing, removing residual acid solution from the surface of the N-type silicon wafer;

(5) proceeding with a second pure water washing and a second mixed acid washing, removing residual impurities from the surface of the N-type silicon wafer;

(6) proceeding with a third pure water washing and air drying;

(7) proceeding with a third mixed acid washing, etching the PN junction on an edge and the back surface of the N-type silicon wafer;

(8) proceeding with a fourth pure water washing and a second alkaline washing, removing residual acid solution from the surface of the N-type silicon wafer;

(9) proceeding with a fifth pure water washing and a fourth mixed acid washing, removing residual impurities from the surface of the N-type silicon wafer;

(10) proceeding with a sixth pure water washing and air drying; and

(11) after air drying, completing etching on the N-type bifacial cell.

Preferably, pure water was used to form the water film covering the front surface of the N-type silicon wafer, and the water film completely covered the front surface of the N-type silicon wafer. The first mixed acid washing used a mixed solution of HF solution and $HNO_3$ solution having a volume ratio of 1:10 to 10:1, wherein the concentration of HF solution was 49 wt %, and the concentration of $HNO_3$ solution was 70 wt %. The first alkaline washing used a strong alkaline solution having a concentration of 0.5-15 wt %, and the strong alkaline solution included NaOH solution, KOH solution, or sodium carbonate solution. The second mixed acid washing used a mixed solution of HF solution and HCl solution having a volume ratio of 1:10 to 10:1, wherein the concentration of HF solution was 49 wt %, and the concentration of HCl solution was 37 wt %. The third acid washing used a mixed solution of HF solution, $HNO_3$ solution, and $H_2SO_4$ solution having a volume ratio of 1:2:1 to 1:10:5, wherein the concentration of HF solution was 49 wt %, the concentration of $H_2SO_4$ solution was 99 wt %, and the concentration of $HNO_3$ solution was 70 wt %. The second alkaline washing used a strong alkaline solution having a concentration of 0.5-15 wt %, and the strong alkaline solution included NaOH solution or KOH solution. The fourth mixed acid washing used a mixed solution of HF solution and HCl solution having a volume ratio of 1:10 to 10:1, wherein the concentration of HF solution was 49 wt %, and the concentration of HCl solution was 37 wt %.

Specifically, an N-type silicon wafer was provided, surface structuralization was proceeded on the N-type silicon wafer, and a PN junction was produced on the surface (including the front surface, the back surface, and the edge) of the N-type silicon wafer by using a boron diffusion technique. A first mixed acid consisting of HF solution and HCl solution mixed at a volume ratio of 10:1 was used to etch the PN junction on the edge and the back surface of the N-type silicon wafer, leaving the PN junction on the front surface to increase the polishing passivation effect of the back surface. Then, a first pure water washing and 0.5 wt % KOH solution washing were carried out to remove residual acid solution from the surface of the N-type silicon wafer. Next, a second pure water washing and a second mixed acid consisting of HF solution and HCl solution mixed at a volume ratio of 1:2 were used to remove residual impurities from the surface of the N-type silicon wafer. Then, a third pure water washing and air drying were conducted. Next, a third mixed acid consisting of HF solution, $HNO_3$ solution, and $H_2SO_4$ solution mixed at a volume ratio of 1:7:2 was used to etch the PN junction on the edge and the back surface of the N-type silicon wafer, increasing the polishing passivation effect of the back surface. Then, a fourth pure water washing and 0.5 wt % NaOH solution washing were carried out to remove residual acid solution from the surface of the N-type silicon wafer. Next, a fifth pure water washing and a fourth mixed acid solution consisting of HF solution and HCl solution mixed at a volume ratio of 10:1 were used to remove residual impurities from the surface of the N-type silicon wafer. Finally, a sixth pure water washing and air drying were conducted, completing etching on the N-type bifacial cell.

In the wet etching method for an N-type bifacial cell according to the present invention, the water film can achieve a function of protecting the front surface of the N-type silicon wafer. Under the premise of assuring the cell efficiency is not reduced, the polishing passivation effect on the back surface is further increased by the corrosive function of the first mixed acid and the third mixed acid, thereby increasing the optical-electrical conversion efficiency of the N-type bifacial cell. Furthermore, increasing the etching on the edge and the back surface can remove the PN junction diffused to the edge of the N-type silicon wafer during the boron diffusion procedure and can remove boron silicon glass generated on the surface of the N-type silicon wafer during the diffusion procedure, avoiding the leakage problem on the edge of the N-type bifacial cell product.

The foregoing describes the preferred embodiments of the invention and is not intended to restrict the invention in any way. Although the invention has been described in connection with the above embodiments, however, the embodiments are not used to restrict the invention. A person skilled in the art can make equivalent embodiments with equivalent changes through some alterations or modifications to the invention based on the above disclosed technical contents without departing from the scope of the technical solutions of the invention. Nevertheless, any contents not beyond the technical solutions of the invention and any simple alterations, equivalent changes and modifications to the above embodiments based on the technical substantiality of the invention are still within the scope of the technical solutions of the invention.

The invention claimed is:
1. A wet etching method for an N-type bifacial cell, comprising:
   (1) providing an N-type silicon wafer, proceeding with surface structuralization on the N-type silicon wafer, and producing a PN junction on a surface of the N-type silicon wafer by using a boron diffusion technique;
   (2) proceeding with a first mixed acid washing, etching the PN junction on an edge and a back surface of the N-type silicon wafer;
   (3) proceeding with a first pure water washing and a first alkaline washing, removing residual acid solution from the surface of the N-type silicon wafer;
   (4) proceeding with a second pure water washing and a second mixed acid washing, removing residual impurities from the surface of the N-type silicon wafer;
   (5) proceeding with a third pure water washing and air drying; and
   (6) after air drying, completing etching on the N-type bifacial cell.

2. The wet etching method for an N-type bifacial cell as claimed in claim 1, wherein steps (2)-(5) are repeated.

3. The wet etching method for an N-type bifacial cell as claimed in claim 1, wherein the first mixed acid washing uses a mixed solution of HF solution, $HNO_3$ solution, and $H_2SO_4$ solution having a volume ratio of 1:2:1 to 1:10:5, and wherein the concentration of HF solution is 49 wt %, the concentration of $H_2SO_4$ solution is 99 wt %, and the concentration of $HNO_3$ solution is 70 wt %.

4. The wet etching method for an N-type bifacial cell as claimed in claim 1, wherein the first alkaline washing uses a strong alkaline solution having a concentration of 0.5-15 wt %, and the strong alkaline solution includes NaOH solution or KOH solution.

5. The wet etching method for an N-type bifacial cell as claimed in claim 1, wherein the second mixed acid washing uses a mixed solution of HF solution and HCl solution having a volume ratio of 1:10 to 10:1, and wherein the concentration of HF solution is 49 wt %, and the concentration of HCl solution is 37 wt %.

6. A wet etching method for an N-type bifacial cell, comprising:
   (1) providing an N-type silicon wafer, proceeding with surface structuralization on the N-type silicon wafer, and producing a PN junction on a surface of the N-type silicon wafer by using a boron diffusion technique;
   (2) covering a front surface of the N-type silicon wafer with a water film;
   (3) proceeding with a first mixed acid etching processing to increase a passivation effect on a back surface of the N-type silicon wafer;
   (4) proceeding with a first pure water washing and a first alkaline washing, removing residual acid solution from the surface of the N-type silicon wafer;
   (5) proceeding with a second pure water washing and a second mixed acid washing, removing residual impurities from the surface of the N-type silicon wafer;
   (6) proceeding with a third pure water washing and air drying; and
   (7) after air drying, completing etching on the N-type bifacial cell.

7. The wet etching method for an N-type bifacial cell as claimed in claim 6, wherein steps (2)-(6) are repeated.

8. The wet etching method for an N-type bifacial cell as claimed in claim 6, wherein pure water is used to form the water film covering the front surface of the N-type silicon wafer, and the water film completely covers the front surface of the N-type silicon wafer.

9. The wet etching method for an N-type bifacial cell as claimed in claim 6, wherein the first mixed acid washing uses a mixed solution of HF solution and $HNO_3$ solution having a volume ratio of 1:10 to 10:1, and wherein the concentration of HF solution is 49 wt %, and the concentration of $HNO_3$ solution is 70 wt %.

10. The wet etching method for an N-type bifacial cell as claimed in claim 6, wherein the first alkaline washing uses a strong alkaline solution having a concentration of 0.5-15 wt %, and the strong alkaline solution includes NaOH solution, KOH solution, or sodium carbonate solution.

11. The wet etching method for an N-type bifacial cell as claimed in claim 6, wherein the second mixed acid washing uses a mixed solution of HF solution and HCl solution having a volume ratio of 1:10 to 10:1, and wherein the concentration of HF solution is 49 wt %, and the concentration of HCl solution is 37 wt %.

12. A wet etching method for an N-type bifacial cell, comprising:
   (1) providing an N-type silicon wafer, proceeding with surface structuralization on the N-type silicon wafer, and producing a PN junction on a surface of the N-type silicon wafer by using a boron diffusion technique;
   (2) proceeding with a first mixed acid washing, etching the PN junction on an edge and a back surface of the N-type silicon wafer;
   (3) proceeding with a first pure water washing and a first alkaline washing, removing residual acid solution from the surface of the N-type silicon wafer;
   (4) proceeding with a second pure water washing and a second mixed acid washing, removing residual impurities from the surface of the N-type silicon wafer;
   (5) proceeding with a third pure water washing and air drying;
   (6) covering a front surface of the N-type silicon wafer with a water film;
   (7) proceeding with a third mixed acid etching processing to increase a passivation effect on the back surface of the N-type silicon wafer;
   (8) proceeding with a fourth pure water washing and a second alkaline washing, removing residual acid solution from the surface of the N-type silicon wafer;
   (9) proceeding with a fifth pure water washing and a fourth mixed acid washing, removing residual impurities from the surface of the N-type silicon wafer;
   (10) proceeding with a sixth pure water washing and air drying; and
   (11) after air drying, completing etching on the N-type bifacial cell.

13. The wet etching method for an N-type bifacial cell as claimed in claim 12, wherein the first mixed acid washing uses a mixed solution of HF solution, $HNO_3$ solution, and $H_2SO_4$ solution having a volume ratio of 1:2:1 to 1:10:5, and wherein the concentration of HF solution is 49 wt %, the concentration of $H_2SO_4$ solution is 99 wt %, and the concentration of $HNO_3$ solution is 70 wt %.

14. The wet etching method for an N-type bifacial cell as claimed in claim 12, wherein the first alkaline washing uses a strong alkaline solution having a concentration of 0.5-15 wt %, and the strong alkaline solution includes NaOH solution or KOH solution.

15. The wet etching method for an N-type bifacial cell as claimed in claim 12, wherein the second mixed acid washing uses a mixed solution of HF solution and HCl solution having a volume ratio of 1:10 to 10:1, and wherein the concentration of HF solution is 49 wt %, and the concentration of HCl solution is 37 wt %.

16. The wet etching method for an N-type bifacial cell as claimed in claim 12, wherein pure water is used to form the water film covering the front surface of the N-type silicon wafer, and the water film completely covers the front surface of the N-type silicon wafer.

17. The wet etching method for an N-type bifacial cell as claimed in claim 12, wherein the third mixed acid washing uses a mixed solution of HF solution and $HNO_3$ solution having a volume ratio of 1:10 to 10:1, and wherein the concentration of HF solution is 49 wt %, and the concentration of $HNO_3$ solution is 70 wt %.

18. The wet etching method for an N-type bifacial cell as claimed in claim 12, wherein the second alkaline washing uses a strong alkaline solution having a concentration of 0.5-15 wt %, and the strong alkaline solution includes NaOH solution, KOH solution, or sodium carbonate solution.

19. The wet etching method for an N-type bifacial cell as claimed in claim 12, wherein the fourth mixed acid washing uses a mixed solution of HF solution and HCl solution having a volume ratio of 1:10 to 10:1, and wherein the concentration of HF solution is 49 wt %, and the concentration of HCl solution is 37 wt %.

20. A wet etching method for an N-type bifacial cell, comprising:
 (1) providing an N-type silicon wafer, proceeding with surface structuralization on the N-type silicon wafer, and producing a PN junction on a surface of the N-type silicon wafer by using a boron diffusion technique;
 (2) covering a front surface of the N-type silicon wafer with a water film;
 (3) proceeding with a first mixed acid etching processing to increase a passivation effect on a back surface of the N-type silicon wafer;
 (4) proceeding with a first pure water washing and a first alkaline washing, removing residual acid solution from the surface of the N-type silicon wafer;
 (5) proceeding with a second pure water washing and a second mixed acid washing, removing residual impurities from the surface of the N-type silicon wafer;
 (6) proceeding with a third pure water washing and air drying;
 (7) proceeding with a third mixed acid washing, etching the PN junction on an edge and the back surface of the N-type silicon wafer;
 (8) proceeding with a fourth pure water washing and a second alkaline washing, removing residual acid solution from the surface of the N-type silicon wafer;
 (9) proceeding with a fifth pure water washing and a fourth mixed acid washing, removing residual impurities from the surface of the N-type silicon wafer;
 (10) proceeding with a sixth pure water washing and air drying; and
 (11) after air drying, completing etching on the N-type bifacial cell.

21. The wet etching method for an N-type bifacial cell as claimed in claim 20, wherein pure water is used to form the water film covering the front surface of the N-type silicon wafer, and the water film completely covers the front surface of the N-type silicon wafer.

22. The wet etching method for an N-type bifacial cell as claimed in claim 20, wherein the first mixed acid washing uses a mixed solution of HF solution and $HNO_3$ solution having a volume ratio of 1:10 to 10:1, and wherein the concentration of HF solution is 49 wt %, and the concentration of $HNO_3$ solution is 70 wt %.

23. The wet etching method for an N-type bifacial cell as claimed in claim 20, wherein the first alkaline washing uses a strong alkaline solution having a concentration of 0.5-15 wt %, and the strong alkaline solution includes NaOH solution, KOH solution, or sodium carbonate solution.

24. The wet etching method for an N-type bifacial cell as claimed in claim 20, wherein the second mixed acid washing uses a mixed solution of HF solution and HCl solution having a volume ratio of 1:10 to 10:1, and wherein the concentration of HF solution is 49 wt %, and the concentration of HCl solution is 37 wt %.

25. The wet etching method for an N-type bifacial cell as claimed in claim 20, wherein the third acid washing uses a mixed solution of HF solution, $HNO_3$ solution, and $H_2SO_4$ solution having a volume ratio of 1:2:1 to 1:10:5, and wherein the concentration of HF solution is 49 wt %, the concentration of $H_2SO_4$ solution is 99 wt %, and the concentration of $HNO_3$ solution is 70 wt %.

26. The wet etching method for an N-type bifacial cell as claimed in claim 20, wherein the second alkaline washing uses a strong alkaline solution having a concentration of 0.5-15 wt %, and the strong alkaline solution includes NaOH solution or KOH solution.

27. The wet etching method for an N-type bifacial cell as claimed in claim 20, wherein the fourth mixed acid washing uses a mixed solution of HF solution and HCl solution having a volume ratio of 1:10 to 10:1, and wherein the concentration of HF solution is 49 wt %, and the concentration of HCl solution is 37 wt %.

* * * * *